US010373602B2

(12) United States Patent
Zafeiropoulos

(10) Patent No.: US 10,373,602 B2
(45) Date of Patent: Aug. 6, 2019

(54) ACTIVE NOISE CANCELLATION

(71) Applicant: Harman Becker Automotive Systems GmbH, Karlsbad (DE)

(72) Inventor: Nikos Zafeiropoulos, Straubing (DE)

(73) Assignee: Harman Becker Automotive Systems GmbH, Karlsbad-Ittersbach (DE)

( * ) Notice: Subject to any disclaimer, the term of this patent is extended or adjusted under 35 U.S.C. 154(b) by 0 days.

(21) Appl. No.: 16/149,186

(22) Filed: Oct. 2, 2018

(65) Prior Publication Data

US 2019/0130891 A1 May 2, 2019

(30) Foreign Application Priority Data

Oct. 26, 2017 (EP) .................................... 17198562

(51) Int. Cl.
*H03B 29/00* (2006.01)
*G10K 11/178* (2006.01)

(52) U.S. Cl.
CPC .. *G10K 11/17881* (2018.01); *G10K 11/17823* (2018.01); *G10K 11/17825* (2018.01); *G10K 2210/121* (2013.01); *G10K 2210/3044* (2013.01)

(58) Field of Classification Search
CPC ...................................................... H03B 29/00
See application file for complete search history.

(56) References Cited

U.S. PATENT DOCUMENTS 5,416,845 A 5/1995 Qun
5,511,127 A * 4/1996 Warnaka .............. G10K 11/178 381/71.5
5,917,919 A 6/1999 Rosenthal
6,084,971 A * 7/2000 McLean ............... F02M 35/125 381/71.5
2010/0177905 A1* 7/2010 Shridhar .............. G10K 11/178 381/71.11
2011/0172001 A1* 7/2011 Schoerkmaier ....... H04M 1/035 455/575.1
2013/0028440 A1* 1/2013 Perkmann ............ G10K 11/178 381/94.1
2013/0108067 A1 5/2013 Schumacher
2015/0010164 A1* 1/2015 Christoph ............ G10K 11/178 381/71.6
2015/0060192 A1* 3/2015 Wink ...................... F01N 13/08 181/245
2015/0159527 A1* 6/2015 Nording ................. B60K 13/04 181/206
2015/0255054 A1* 9/2015 Keck ........................ G10H 5/10 381/61
2015/0256953 A1 9/2015 Kwatra
(Continued)

FOREIGN PATENT DOCUMENTS

CN 107240391 A 10/2017

*Primary Examiner* — Olisa Anwah
(74) *Attorney, Agent, or Firm* — Angela M. Brunetti

(57) ABSTRACT

An active noise cancellation system and method, in which an active noise controller generates an anti-noise signal based on an error signal, and a loudspeaker operatively coupled to the active noise controller converts the anti-noise signal into anti-noise sound. An acoustic error sensor operatively coupled to the active noise controller picks up sound and converts the picked-up sound into the error signal. The acoustic error sensor is disposed at a front face of the loudspeaker.

13 Claims, 2 Drawing Sheets

(56) References Cited

U.S. PATENT DOCUMENTS

| | | | | |
|---|---|---|---|---|
| 2015/0287399 | A1* | 10/2015 | Zintel | G10K 11/002 381/61 |
| 2016/0138967 | A1* | 5/2016 | Schuhmacher | G01H 17/00 73/645 |
| 2017/0077906 | A1 | 3/2017 | Argyropoulos | |
| 2017/0110108 | A1* | 4/2017 | Christoph | G10K 11/17883 |
| 2017/0125006 | A1* | 5/2017 | Dzhigan | G10K 11/17881 |
| 2017/0133003 | A1* | 5/2017 | Nicolai | F01N 1/166 |
| 2017/0175602 | A1* | 6/2017 | Nguyen | F01N 1/065 |
| 2017/0294181 | A1 | 10/2017 | Koch | |
| 2018/0190258 | A1* | 7/2018 | Mohammad | G10K 11/1786 |
| 2018/0242082 | A1* | 8/2018 | Hua | H04R 3/02 |
| 2019/0013004 | A1* | 1/2019 | Vinamata | G10K 11/17879 |

* cited by examiner

ACTIVE NOISE CANCELLATION

CROSS REFERENCE

Priority is claimed to application Ser. No. 17198562.5, filed Oct. 25, 2017 in Europe, the disclosure of which is incorporated in its entirety by reference.

BACKGROUND

1. Technical Field

The disclosure relates to a system and method (generally referred to as a "system") for active noise cancellation, particularly applicable in a higher temperature environment.

2. Related Art

Engine order cancellation (EOC) is commonly used to reduce noise caused by harmonic disturbances generated by motors and engines such as combustion engines. EOC is a type of active noise control (ANC) that uses signals originating from the engines such as the revolutions per minute (RPM) signal as a reference to generate a sound wave that is opposite in phase to the engine vibration-induced noise. In addition, error microphones provide feedback on the amplitude and phase to refine noise-cancelling effects. The concept of EOC can also be applied in environments such as, for example, heating, ventilation and air conditioning (HVAC) environments or vehicle exhaust environments. Duct-like arrangements, as they may be used in the environments mentioned above, provide a good basis for the application of ANC including EOC to achieve an all encompassing noise reduction. However, these environments may also include obstacles to implementing ANC such as, e.g., high ambient temperatures, low ambient temperatures, humidity, moisture and chemically aggressive substances, and, thus, the requirements to the ANC systems operated in these environments are high. While sensor technology has made some progress, the performance of ANC in total when operated under harsh environmental conditions such as high temperatures is still not satisfactory.

SUMMARY

A system includes an active noise controller configured to generate an anti-noise signal based on an error signal, and a loudspeaker operatively coupled to the active noise controller and configured to convert the anti-noise signal into anti-noise sound. An acoustic error sensor operatively coupled to the active noise controller is configured to pick up sound and to convert the picked-up sound into the error signal, wherein the loudspeaker comprises a front face, and the acoustic error sensor is disposed at the front face of the loudspeaker.

A method includes generating, with an active noise controller, an anti-noise signal based on an error signal, and converting, with a loudspeaker, the anti-noise signal into anti-noise sound. The method further includes picking up sound with an acoustic error sensor, and converting the picked-up sound into the error signal. The loudspeaker comprises a front face, and the acoustic error sensor is disposed at the front face of the loudspeaker.

Other arrangements, features and advantages will be, or will become, apparent to one with skill in the art upon examination of the following detailed description and appended figures. It is intended that all such additional arrangements, features and advantages be included within this description, be within the scope of the invention, and be protected by the following claims.

BRIEF DESCRIPTION OF THE DRAWINGS

The arrangements may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION

Figure 1:
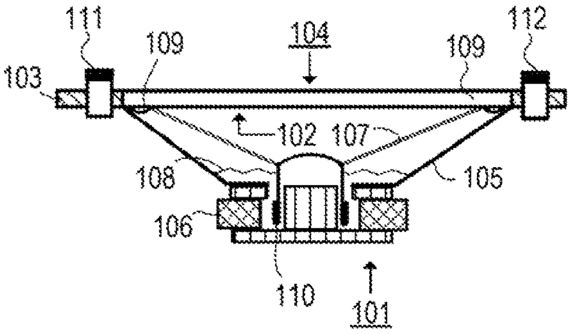
FIG. 1 is a schematic cross-sectional view illustrating a loudspeaker-microphone arrangement applicable in exhaust systems, the loudspeaker-microphone arrangement includes a mounting ring and microphones attached to or integrated in the mounting ring.

Although some of the weaknesses of sound sources and sensors to be operated in harsh environmental conditions could be overcome by, e.g., improving their robustness against weak acids, moisture, humidity and even high temperatures, aspects such as high temperatures are still problematic since temperature is also a condition that affects the speed of sound. Heat, like sound, is a form of kinetic energy. Molecules at higher temperatures have more energy, thus they can vibrate faster. Since the molecules vibrate faster, sound waves can travel more quickly. The speed of sound in room temperature air is 346 meters per second. This is faster than 331 meters per second, which is the speed of sound in air at freezing temperatures. The formula that describes the speed of sound in air over temperature is as follows: $v=(331+0.6\cdot\vartheta/C)$ m's, in which v is the speed of sound and $\vartheta$ is the temperature of the air in degree Celsius. It should be noted that this equation finds the average speed of sound for any given temperature. However, the speed of sound is also affected by other factors such as humidity and air pressure.

Therefore, the performance of active noise control systems for exhaust systems can be significantly affected by major temperature fluctuations due to varying operating conditions and major exhaust gas pressure fluctuations due to inconsistent (e.g., pulsed) gas flow in the exhaust system, which influence the acoustics within the exhaust system. For example, the speed of sound in the exhaust system when an engine is started at an ambient temperature of −20° C. is 319 m/s. In contrast, with an engine at full power and at high ambient temperatures the temperature within an exhaust system can be up to 850° C., which transforms into a speed of sound of 841 m/s. However, a higher speed of sound requires a shorter response time of the noise control. For example, it takes sound waves in hot gas with a temperature of 700° C. around 1.1 ms to travel through the exhaust system. By comparison, a typical noise control implemented in a low latency microprocessor may have a processing delay time of up to 1 ms.

In the noise control system described below, a significant increase of response time is achieved, even without modifying the signal processing structure in the noise controller or the noise controller itself, by reducing the length of the secondary path, i.e., the distance between a loudspeaker that radiates noise cancelling sound and an error microphone that picks up the residual sound upon interfering the noise cancelling sound with the noise. Commonly, the loudspeaker is disposed somewhere in the middle of the exhaust system and the error microphone, towards the exhaust system's end. For example, one or more microphones may be mounted at a mounting ring of the loudspeaker or in the middle of the loudspeaker. In this way, the secondary path delay is significantly reduced and the noise controller is able to respond faster when the speed of sound is very high at high gas temperatures.

Figure 2:
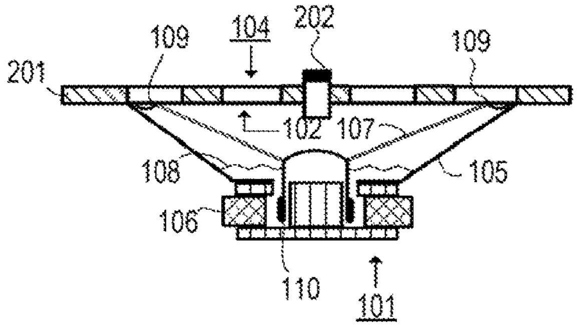
FIG. 2 is a schematic cross-sectional view illustrating a loudspeaker-microphone arrangement applicable in exhaust systems, the loudspeaker-microphone arrangement includes a front grille and a microphone attached to or integrated in the front grille.
Figure 3:
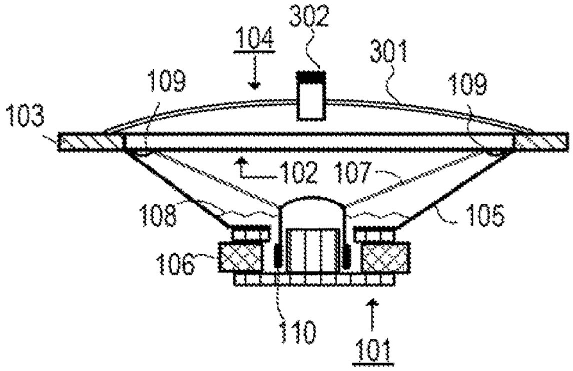
FIG. 3 is a schematic cross-sectional view illustrating a loudspeaker-microphone arrangement applicable in exhaust systems, the loudspeaker-microphone arrangement includes a land and a microphone attached to or integrated in the land.

In exemplary loudspeaker-microphone arrangements shown in FIGS. 1 to 3, a loudspeaker 101 is air-tightly mounted in or at an aperture 102 of rigid mounting ring 103 that may attach the loudspeaker 101 at its front face 104 to an enclosure (not shown). The loudspeaker 101 has a rigid, air-permeable basket 105 as a basic structure to which a magnet system 106 is fixedly mounted and to which a membrane 107 is movably attached via a resilient spider 108 and a resilient suspension 109 to allow for an inward and outward movement of the membrane 107 relative to the basket 105. The membrane 107 is rigidly and air-tight (e.g., using a dust cap) connected to a voice coil 110 that dips into an air-gap of the magnet system 106.

Referring now to FIG. 1, one, two (shown) or more acoustic error sensors, e.g., error microphones 111 and 112, are fastened and/or integrated in a loudspeaker mount at the front face 104, e.g., mounting ring 103, or any other suitable element such as an outer part of the chassis 105 or an adjacent part of a baffle (not shown) to which the loudspeaker 101 is fastened. The directivity of the error microphones 1 and 112 may be such that a main lobe of directivity points away from the loudspeaker 101. Referring to FIG. 2, instead of loudspeaker mount, a grille 201 or the like may be used to dispose one (shown), two or more acoustic error sensors, e.g., an error sensor 202 at the front face 104 of loudspeaker 101, e.g., in the center thereof. Alternatively, a land 301 that runs from one side of the aperture 109 to its opposite side may support one (shown), two or more acoustic error sensors. e.g., an error sensor 302.

Figure 4:
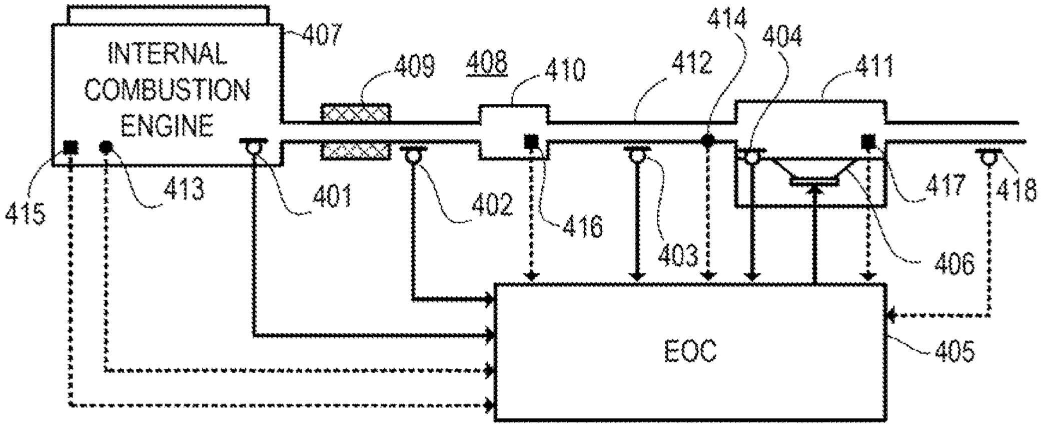
FIG. 4 is a schematic diagram illustrating an exhaust system of an internal combustion engine with an exemplary EOC system including a loudspeaker and an error microphone closely disposed to the loudspeaker as shown in FIGS. 1 to 3.

The loudspeaker-microphone arrangements shown in FIGS. 1 to 3 may be used in connection with an engine order control (EOC) system as illustrated in FIG. 4 or any other active noise control (ANC) system. The EOC system shown in FIG. 4 includes three reference microphones 401 to 403 and an error microphone 404, which are connected to an active noise controller, e.g. an EOC controller 405. The EOC controller 405 drives a loudspeaker 406, such as loudspeaker 101 of the loudspeaker-microphone arrangements shown in FIGS. 1 to 3. The reference microphone 401 is disposed at, e.g., secured to a noise source, i.e., an internal combustion engine 407. The internal combustion engine 407 is connected to an exhaust system 408 which includes a catalyst unit 409, a center muffler 410 and a rear muffler 411 connected in series by way of a tube system 412. The reference microphone 402 is disposed at, e.g., secured to the tube system 412 between the catalyst unit 409 and the center muffler 410, e.g., close to the catalyst unit 409. The reference microphone 403 is disposed at, e.g., secured to the tube system 412 between the center muffler 410 and the rear muffler 411. The error microphone 404 is disposed close to the loudspeaker 406 in or attached to the rear muffler 411.

Signals (reference signals) from the reference microphones 401 to 403 are processed by the EOC controller 405 along with an error signal (or error signals) from the error microphone 404 (and other error microphones) to generate a drive signal for the loudspeaker 406. The acoustic path that extends from the combustion engine 407 to the error microphone 404 is referred to as the acoustic primary path. The path between loudspeaker 406 and the error microphone 404 is referred to as the acoustic secondary path. Since acoustic feedback from a secondary loudspeaker such as loudspeaker 406 to a reference sensor such as reference microphone 404 is known to cause robustness problems in practical active noise control applications it is more reliable to use, alternatively or additionally, a non-acoustical reference sensor, such as acceleration reference sensors 413 and 414. For example, acceleration reference sensor 413 may be disposed at the internal combustion engine 407 and acceleration reference sensor 413 may be disposed at the tube system 412 between center muffler 410 and the rear muffler 411, e.g., close to the rear muffler. In the case of machines and engines that predominantly produce periodic signals, a pure reference signal without any interferences can be generated using e.g., a rotational speed signal generator in connection with a synthesizer. However, the latency time of such arrangements can be significantly longer than with microphones. Optionally, temperature sensors 415 to 417 may be employed for EOC control, e.g., latency time control. For example, sensor 415 may be disposed at the internal combustion engine 407, sensor 416 in the center muffler 410 and sensor 417 in the rear muffler. Additional error microphones may be employed which may be disposed further away from the loudspeaker such as a microphone 418 in FIG. 4. For example, microphone 418 may be disposed at a final section of the exhaust system. The EOC controller 405 may be, form or include a multiple-input single-output (MISO) system.

Figure 5:
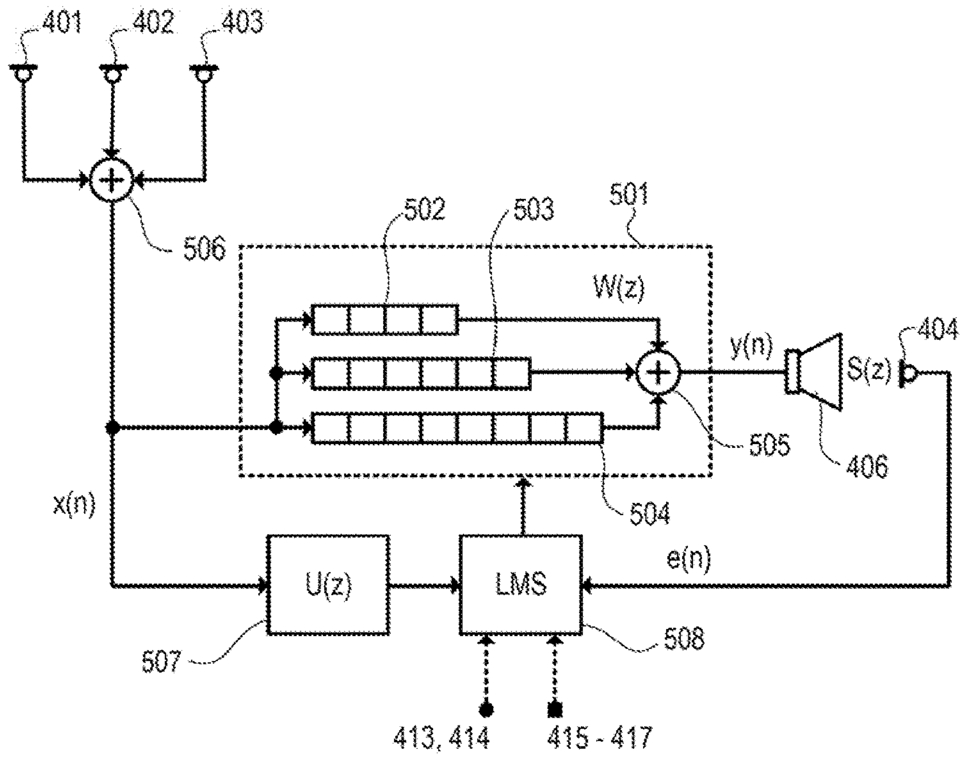
FIG. 5 is a schematic diagram illustrating an exemplary EOC controller applicable in the EOC system shown in FIG. 4.

Suitable noise control schemes implemented in the EOC controller 405 may utilize, for example, the least mean square (LMS) algorithm, a filtered-X least mean square (FxLMS) algorithm, the filtered U-recursive least mean square (FURLMS) algorithm or the hybrid filtered-X least mean square (HFXLMS) algorithm. Robustness, e.g., stability, of the control scheme employed can be enhanced by reducing the effects of temperature fluctuations in the secondary path, e.g., by reducing the secondary path. An additional approach is to reduce the latency of the noise control, i.e., EOC controller 405 as described below with reference to FIG. 5.

Engine and exhaust noise are composed by engine harmonics that are commonly reduced by way of an adaptive noise filter, e.g., a controllable finite impulse response (FIR) filter. In the structure shown in FIG. 5, a controllable noise filter 501 with a transfer function W(z) includes a multiplicity of FIR filters, e.g., FIR filters 502 to 504, that have different FIR filter lengths such that their center frequencies (frequency ranges) match the frequencies (frequency ranges) of each (significant) exhaust noise component. The basic filter structure is a parallel structure with filters of varying length l (in taps) that are determined from the exhaust noise component wave length. The length l of FIR filters 502 to 504 that are used to control the frequencies, i.e., orders can be described as:

$$l=2\cdot 60\cdot f_s/(\mathrm{RPM}\cdot\Delta),$$

in which $f_s$ is a sampling rate, RPM is the rotational speed of the engine, and Δ is the engine order distance. FIR filters 502 to 504 are supplied with a reference signal x(n) and their outputs are summed up by a summer 505 to provide the output signal y(n) of the controllable noise filter 501. Reference signal x(n) may be the sum (e.g., derived by way of a summer 506) of reference signals provided by the reference microphones 401 to 403. The reference signal x(n) is also supplied to eigenvalue filter 507 which provides a filtered reference signal to a filter controller 508. The filter controller 508 also receives an error signal e(n) from error microphone 404 and optionally signals from acceleration reference sensors 413 and 414 and/or temperature sensors 415 to 417 to control, based on an adaptation scheme such as LMS, the noise filter 501. The noise filter 501 may be fully operated in the frequency domain.

In an exemplary control structure, the secondary path transfer function or, more general, secondary path matrix (e.g., i×j, i≥1, j≥1), is decomposed in order to be less dependent on uncertainties in the secondary path that are common in an exhaust secondary path matrix S:

$$S=U\Sigma V,$$

in which U is an eigenvalue matrix of the secondary path matrix S and V is the vector space. An update procedure of an FxLMS algorithm in the frequency domain can be rewritten in the time domain as:

$$w_{MKI}(n+N)=w_{MKI}(n)+IFFT\{\mu(k)S_{LMK}(k)E_L(k)\}.$$

in which N is a Fast Fourier transformation (FFT) size, k is a number frequency bins, M is a number of loudspeakers, K is a number of reference signals, I is a number of filter coefficients, n represents a discrete time, μ(k) represents a step size, $E_L(k)$ is an error signal vector, $S_{LMK}(k)$ is a secondary path (transfer function) matrix, and $w_{MKI}(n)$ and $w_{MKI}(n+N)$ are filter transfer functions.

Instead of using the actual secondary path matrix, the most important eigenvalues can be directly used to compensate for strong dependencies on secondary path uncertainties and updating the noise control filter in the frame based sense at the frequency domain as follows:

$$W_{MKI}(k+N)=W_{MKI}(k)+\mu(k)U^H(k)E_L(k)\}$$

Additionally, a stability condition may be implemented based on the magnitude of the noise control filter with transfer function W(k), which is carefully selected so that the output of the control structure does not overdrive the loudspeaker:

$$20\cdot\log_{10}(|W_{min}|)<20\cdot\log_{10}(|w_{MKI}(k)|)<20\cdot\log_{10}(|W_{max}|)$$

The actual update equation can be normalized by the reference signal:

$$W_{MKI}(k+N)=W_{MKI}(k)+\mu(k)U^H(k)E_L(k)/X(k)$$

and also by the maximum value of the next update as follow in the case that it exceeds the maximum allowed magnitude of the noise control filter with transfer function W(k):

$$W_{MKI}(k+N)=W_{MKI}(k+N)[W_{max}/|W_{MKI}(k+N)|]^{1/2}.$$

It is recognized that the exemplary control structure described above, in which the eigenvalue matrix of the secondary path matrix is employed instead of the secondary path matrix, may be applied in connection with any type of noise filter (both those filters mentioned above as well as filters with different structures, behaviors and characteristics) and in connection with any microphone position (both those positions mentioned above as well as others). This control structure may include an update procedure that implements a stability condition based on the magnitude of the noise control filter transfer function, the stability condition being configured to prevent the loudspeaker from overdrive, and/or that updates the transfer characteristics of the finite impulse response filters, the update procedure being normalized to at least one reference noise signal representative of noise from at least one noise source.

The adaptive controller may be a multiple-input (single-output) system that uses several temperature and NVH sensors to sense changes in the sound field and may use a direct connection instead of a bus (e.g., CAN bus) that transfers the reference signals to avoid latency issues. In another example, a reference sensor may be used at the output of the catalyst and several microphones around the loudspeaker ring are used as multiple error signals.

Figure 6:
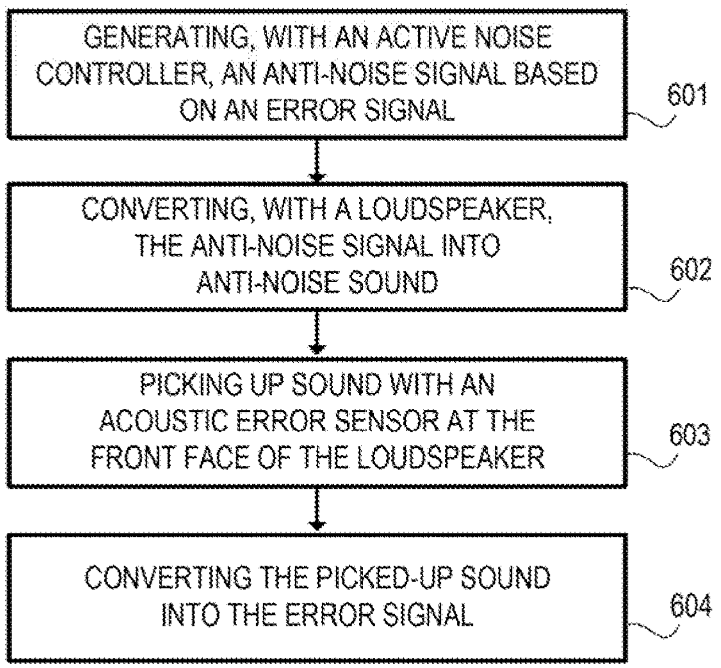
FIG. 6 is a flow chart illustrating a method for EOC employing a loudspeaker-microphone arrangement as shown in FIGS. 1 to 3.

An exemplary method for EOC in an exhaust system, as shown in FIG. 6, includes generating, with an active noise controller, an anti-noise signal based on an error signal (601), and converting, with a loudspeaker, the anti-noise signal into anti-noise sound (602). The method further includes picking up sound with an acoustic error sensor (603) and converting the picked-up sound into the error signal (604), wherein the acoustic error sensor is disposed at the front face of the loudspeaker.

Parts or all of the systems or methods described herein may be implemented as software and/or firmware executed by a processor or a programmable digital circuit. It is recognized that any EOC system as disclosed herein may include any number of microprocessors, integrated circuits, memory devices (e.g., FLASH, random access memory (RAM), read only memory (ROM), electrically programmable read only memory (EPROM), electrically erasable programmable read only memory (EEPROM), or other suitable variants thereof) and software which co-act with one another to perform operation(s) disclosed herein. In addition, any acoustic echo canceler circuitry as disclosed may utilize any one or more microprocessors to execute a computer-program that is embodied in a non-transitory computer readable medium that is programmed to perform any number of the functions as disclosed. Further, any controller as provided herein includes a housing and a various number of microprocessors, integrated circuits, and memory devices, (e.g., FLASH, random access memory (RAM), read only memory (ROM), electrically programmable read only memory (EPROM), and/or electrically erasable programmable read only memory (EEPROM).

The description of embodiments has been presented for purposes of illustration and description. Suitable modifications and variations to the embodiments may be performed in light of the above description or may be acquired from practicing the methods. The described arrangements are exemplary in nature, and may include additional elements and/or omit elements. As used in this application, an element recited in the singular and proceeded with the word "a" or "an" should be understood as not excluding plural of said elements, unless such exclusion is stated. Furthermore, references to "one embodiment" or "one example" of the present disclosure are not intended to be interpreted as excluding the existence of additional embodiments that also incorporate the recited features.

While various embodiments of the invention have been described, it will be apparent to those of ordinary skilled in the art that many more embodiments and implementations are possible within the scope of the invention. In particular, the skilled person will recognize the interchangeability of various features from different embodiments. Although these techniques and systems have been disclosed in the context of certain embodiments and examples, it will be understood that these techniques and systems may be extended beyond the specifically disclosed embodiments to other embodiments and/or uses and obvious modifications thereof.

The invention claimed is:

1. A system comprising:

an active noise controller configured to generate an anti-noise signal based on an error signal;

one or more reference sensors operatively coupled to the active noise controller and configured to provide one or more reference signals that characterize at least one noise source;

a loudspeaker mounted to an exhaust system of a vehicle, the exhaust system being mechanically connected to an engine and comprising a catalyst, a center muffler and a rear muffler, the loudspeaker being mounted to the rear muffler, the loudspeaker having a front face, the loudspeaker operatively coupled to the active noise controller and configured to convert the anti-noise signal into anti-noise sound;

at least one of a loudspeaker mount, a grille, and a land at the front face of the loudspeaker;

a first one of the reference sensors is acoustically or mechanically coupled to the engine;

a second one of the reference sensors is acoustically or mechanically coupled to the exhaust system between the catalyst and the center muffler:

a third one of the reference sensors is acoustically or mechanically coupled to the exhaust system between the center muffler and the rear muffler; and acoustic error sensors mounted to one of the loudspeaker mount, the grille, or the land at the front face of the loudspeaker and operatively coupled to the active noise controller, the acoustic error sensors being configured to pick up sound and to convert the picked-up sound into the error signal.

2. The system claim 1, wherein the active noise controller further comprises:

at least one adaptive noise filter; and a filter controller configured to control the transfer characteristics of the at least one adaptive noise filter based on an eigenvalue of a secondary path between the loudspeaker and the acoustic error sensors.

3. The system of claim 2, wherein the filter controller is further configured to execute at least one update procedure selected from the group consisting of:

an update procedure that is configured to implement a stability condition based on a magnitude of a noise control filter transfer function, the stability condition being configured to prevent the loudspeaker from overdrive; and an update procedure that is configured to update transfer characteristics of a plurality of finite impulse response filters, the update procedure being normalized to at least one reference noise signal representative of noise from at least one noise source.

4. The system of claim 1, wherein the active noise controller further comprises a plurality of adaptive noise filters connected in parallel, each adaptive noise filter has a finite impulse response filter with a filter length that differs from the other adaptive noise filters.

5. A system comprising:

an active noise controller configured to generate an anti-noise signal based on an error signal;

one or more reference sensors including at least one of a temperature sensor and a noise-vibration-harshness sensor operatively coupled to the active noise controller to provide temperature measurements and noise and vibration measurements at various positions, the one or more reference sensors being operatively coupled to the active noise controller and configured to provide at least one reference signal representative of noise from at least one noise source, a first one of the reference sensors is acoustically coupled to an engine, a second one of the reference sensors is acoustically coupled to an exhaust system between a catalyst and a center muffler, and a third one of the reference sensors is acoustically coupled to the exhaust system between the center muffler and a rear muffler;

a loudspeaker mounted to the exhaust system and having a front face, the loudspeaker operatively coupled to the active noise controller and configured to convert the anti-noise signal into anti-noise sound;

an acoustic error sensor disposed at the front face of the loudspeaker and operatively coupled to the active noise controller, the acoustic error sensor being configured to pick up sound and to convert the picked-up sound into the error signal; and the active noise controller being further configured to generate an anti-noise signal that is also based on measurements of at least one of temperature measurements at various positions and noise and vibrations measurements at various positions.

6. A method comprising:

with an active noise controller, generating an anti-noise signal based on an error signal;

with a loudspeaker, converting the anti-noise signal into anti-noise sound, the loudspeaker is mounted to an exhaust system of a vehicle, the exhaust system being mechanically connected to an engine and comprising a catalyst, a center muffler and a rear muffler, the loudspeaker being mounted to the rear muffler;

with an acoustic error sensor, picking up sound and converting the picked-up sound into the error signal; wherein the loudspeaker comprises a front face, and at its front face at least one of a loudspeaker mount, grille and land;

with one or more reference sensors, providing to the active noise controller at least one reference noise signal representative of noise from at least one noise source, one or more reference sensors are acoustically coupled in a manner selected from the group consisting of: a first one of the reference sensors acoustically coupled to the engine, a second one of the reference sensors acoustically coupled to the exhaust system between the catalyst and the center muffler, and a third one of the reference sensors acoustically coupled to the exhaust system between the center muffler and the rear muffler; and the acoustic error sensor is mounted at the front face of the loudspeaker to one of the loudspeaker mount, grille or land.

7. The method of claim 6, wherein the step of generating an anti-noise signal based on an error signal further comprises:

filtering with at least one adaptive noise filter; and controlling transfer characteristics of the at least one adaptive noise filter based on an eigenvalue of a secondary path between the loudspeaker and the acoustic error sensor.

8. The method of claim 7, wherein the active noise controller further comprises a filter controller configured to execute an update procedure, the method further comprising the step of executing at least one update procedure selected from the group consisting of:

executing an update procedure to implement a stability condition based on a magnitude of a noise control filter transfer function, the stability condition being configured to prevent the loudspeaker from overdrive; and executing an update procedure to update transfer characteristics of a plurality of finite impulse response filters, the update procedure being normalized to at least one reference noise signal representative of noise from at least one noise source.

9. The method of claim 6, wherein the step of generating an anti-noise signal based on an error signal further comprises filtering the anti-noise signal with a plurality of adaptive noise filters connected in parallel, each adaptive noise filter has a finite impulse response filter with a filter length that differs from the other adaptive noise filters.

10. A system comprising:

an active noise controller having a plurality of adaptive noise filters connected in parallel, the active noise controller is configured to generate an anti-noise signal based on an error signal;

each adaptive noise filter has a finite impulse response filter with a filter length different from the other adaptive noise filters;

a loudspeaker haying a front face, the loudspeaker operatively coupled to the active noise controller and configured to convert the anti-noise signal into anti-noise sound, the loudspeaker is mounted to an exhaust system of a vehicle, the exhaust system being mechanically connected to an engine and comprising a catalyst, a center muffler and a rear muffler, the loudspeaker being mounted to the rear muffler, the system further comprises acoustic coupling of one or more reference sensors from the group consisting of; a first one of the reference sensors is acoustically coupled to the engine, a second one of the reference sensors is acoustically coupled to the exhaust system between the catalyst and the center muffler, and a third one of the reference sensors is acoustically coupled to the exhaust system between the center muffler and the rear muffler;

an acoustic error sensor disposed at the front face of the loudspeaker, the acoustic error sensor operatively coupled to the active noise controller, the acoustic error sensor being configured to pick up sound and to convert the picked-up sound into the error signal; and one or more reference sensors operatively coupled to the active noise controller and configured to provide at least one reference noise signal representative of noise from at least one noise source.

11. The system as claimed in claim 10, wherein the active noise controller further comprises:

a filter controller; and the filter controller is configured to control transfer characteristics of at least one adaptive noise filter based on an eigenvalue of a secondary path between the loudspeaker and the acoustic error sensor.

12. The system as claimed in claim 11, wherein the filter controller is configured to execute at least one update procedure from the group consisting of:

a stability condition based on the magnitude of the noise control filter transfer function, the stability condition being configured to prevent the loudspeaker from overdrive; and update the transfer characteristics of the finite impulse response filters, the update procedure being normalized to at least one reference noise signal representative of noise from at least one noise source.

13. A system comprising:

an active noise controller having a plurality of adaptive noise filters connected in parallel, the active noise controller is configured to generate an anti-noise signal based on error signals from acoustic error sensors;

each adaptive noise filter has a finite impulse response filter with a filter length different from the other adaptive noise filters;

at least one of temperature and noise-vibration-harshness sensors operatively coupled to the active noise controller and providing measurements of temperatures and noise and vibrations;

a loudspeaker having a front face, the loudspeaker operatively coupled to the active noise controller and configured to convert the anti-noise signal into anti-noise sound:

the acoustic error sensors disposed at the front face of the loudspeaker, the acoustic error sensors operatively coupled to the active noise controller, the acoustic error sensors being configured to pick up sound and to convert the picked-up sound into the error signal;

one or more reference sensors operatively coupled to the active noise controller and configured to provide at least one reference noise signal representative of noise from at least one noise source; and the active noise controller being further configured to generate an anti-noise signal that is also based on at least one of temperature and noise-vibration-harshness measurements from the sensors.

* * * * *